United States Patent
Kimura et al.

(10) Patent No.: US 10,490,278 B2
(45) Date of Patent: Nov. 26, 2019

(54) SEMICONDUCTOR MEMORY DEVICE

(71) Applicant: Toshiba Memory Corporation, Minato-ku (JP)

(72) Inventors: Keita Kimura, Fujisawa (JP); Masahiko Iga, Yokohama (JP); Yuichiro Suzuki, Sagamihara (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/051,890

(22) Filed: Aug. 1, 2018

(65) Prior Publication Data

US 2019/0287618 A1  Sep. 19, 2019

(30) Foreign Application Priority Data

Mar. 16, 2018  (JP) .................. 2018-049857

(51) Int. Cl.
| | |
|---|---|
| G11C 7/04 | (2006.01) |
| G11C 16/04 | (2006.01) |
| H01L 27/11578 | (2017.01) |
| H01L 27/1157 | (2017.01) |
| G11C 7/06 | (2006.01) |
| G11C 5/06 | (2006.01) |
| G11C 8/14 | (2006.01) |
| G11C 16/34 | (2006.01) |
| G11C 16/08 | (2006.01) |
| G11C 16/28 | (2006.01) |
| G11C 16/14 | (2006.01) |
| G11C 7/18 | (2006.01) |

(52) U.S. Cl.
CPC ............ *G11C 16/0483* (2013.01); *G11C 5/06* (2013.01); *G11C 7/04* (2013.01); *G11C 7/06* (2013.01); *G11C 7/18* (2013.01); *G11C 8/14* (2013.01); *G11C 16/08* (2013.01); *G11C 16/14* (2013.01); *G11C 16/28* (2013.01); *G11C 16/3445* (2013.01); *H01L 27/1157* (2013.01); *H01L 27/11578* (2013.01)

(58) Field of Classification Search
CPC ........................................................ G11C 7/04
USPC ..................................... 365/211, 185.17, 158
See application file for complete search history.

(56) References Cited

U.S. PATENT DOCUMENTS 9,142,277 B2 *  9/2015  Kim .................... G11C 11/1695
2009/0027967 A1  1/2009  Lee
(Continued)

FOREIGN PATENT DOCUMENTS

| JP | 2015-176622 | 10/2015 |
| TW | 200907973 A | 2/2009 |

*Primary Examiner* — Jason Lappas
(74) *Attorney, Agent, or Firm* — Oblon, McClelland, Maier & Neustadt, L.L.P.

(57) ABSTRACT

According to one embodiment, a semiconductor memory device includes a memory string including a first select transistor, a first transistor adjacent to the first select transistor, and a memory cell transistor, a first select gate line, a first interconnect, a word line, a row decoder, a temperature sensor, and a control circuit. In the erase operation, the control circuit selects a first mode for applying a first voltage to the first interconnect when a temperature measured by the temperature sensor is equal to or higher than a first temperature, and selects a second mode for applying a second voltage to the first interconnect when the temperature measured is less than the first temperature.

6 Claims, 13 Drawing Sheets

(56) References Cited

U.S. PATENT DOCUMENTS

2012/0069681 A1    3/2012   Oikawa
2014/0334230 A1   11/2014   Kwon
2015/0262670 A1    9/2015   Hosono
2017/0178736 A1    6/2017   Yang et al.

* cited by examiner

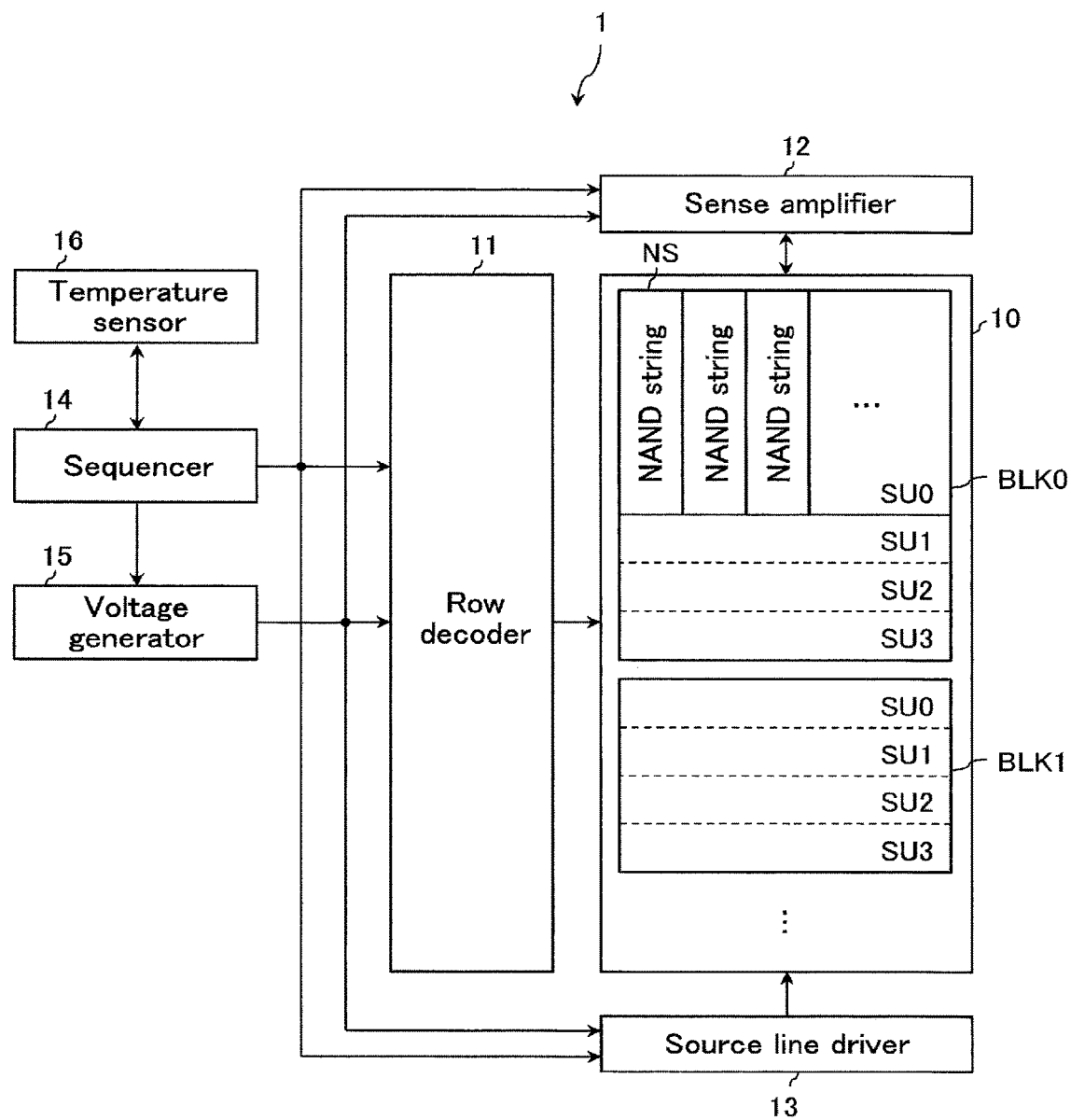
F I G. 1

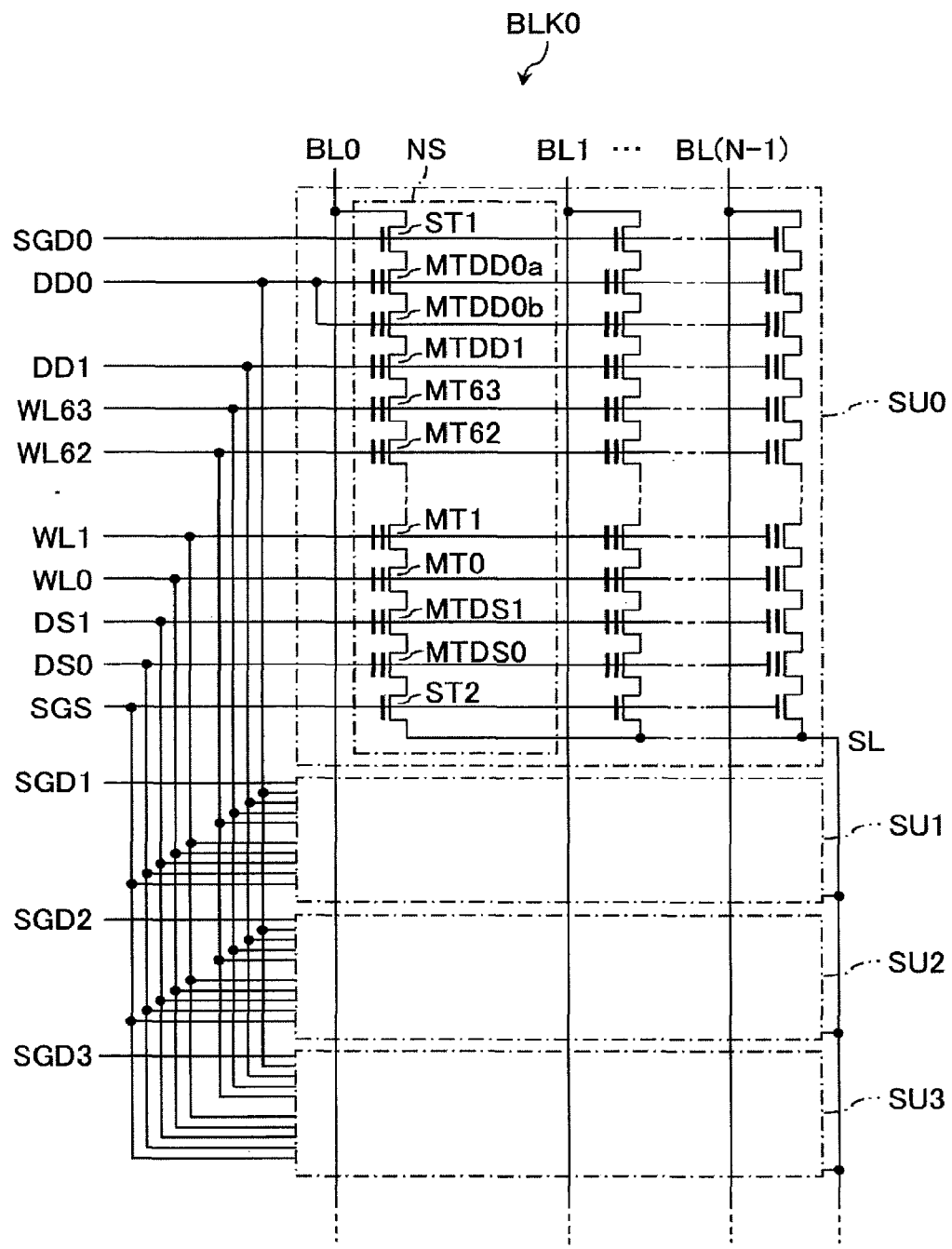
F I G. 2

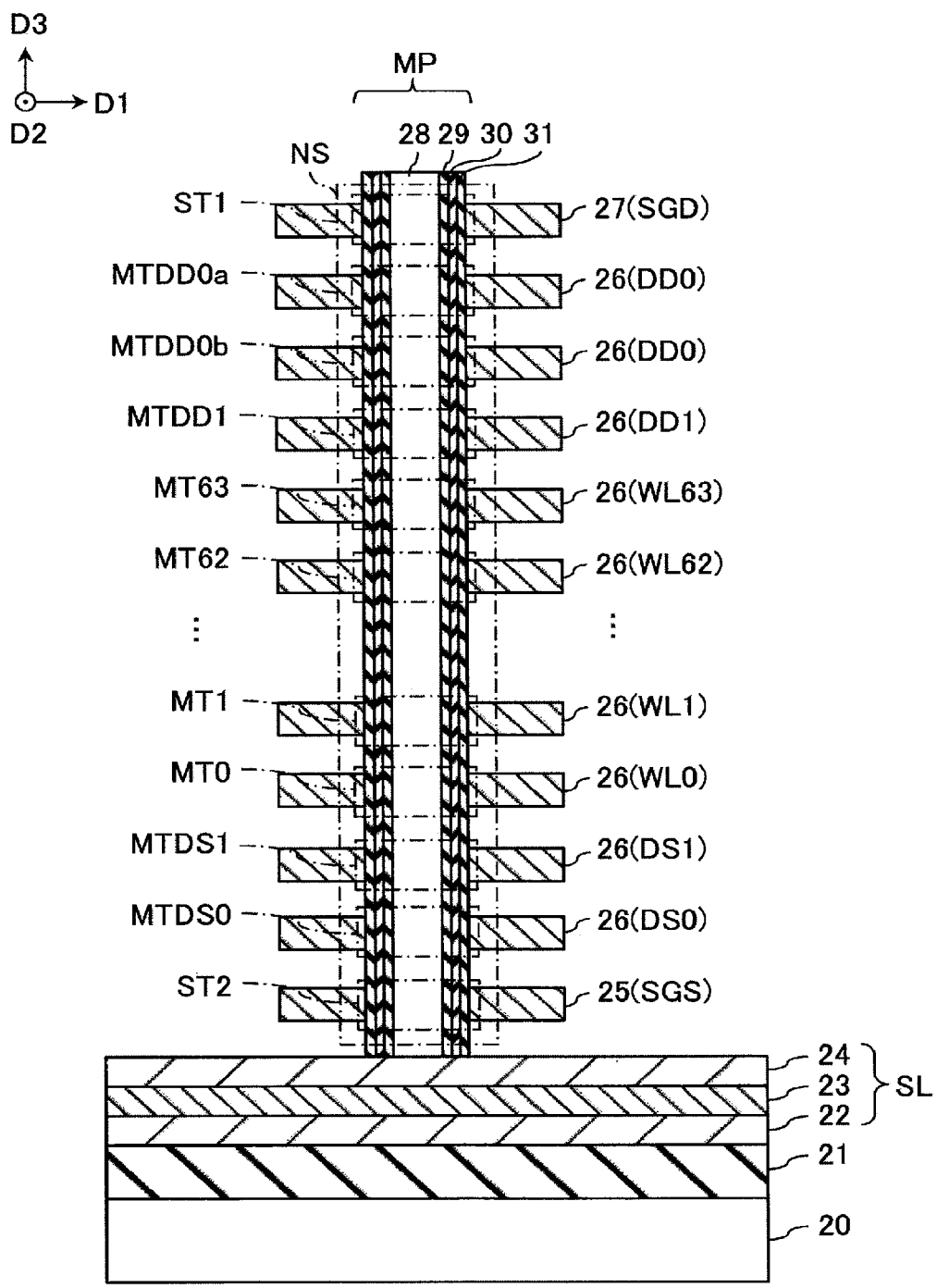
F I G. 3

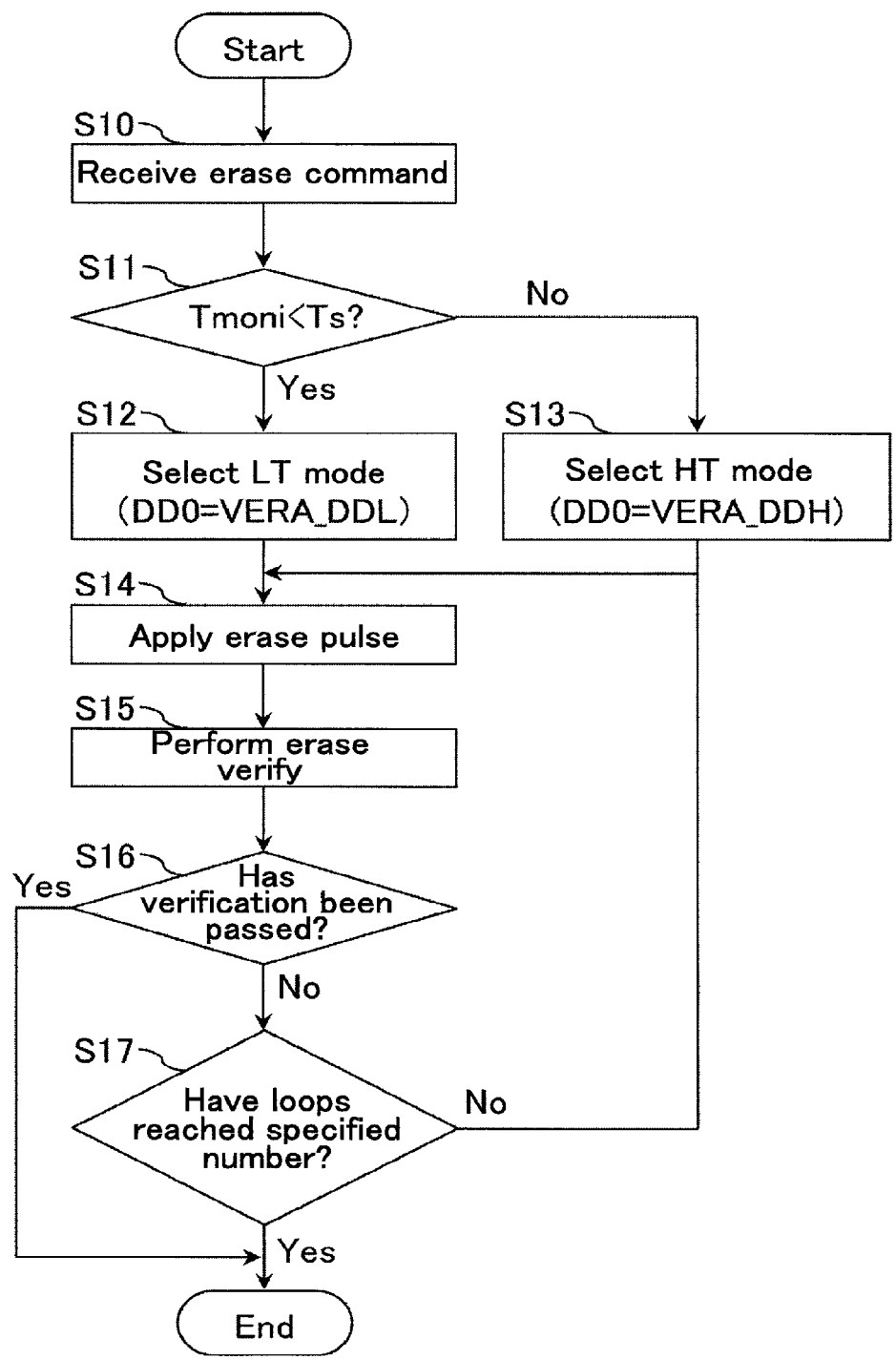
F I G. 4

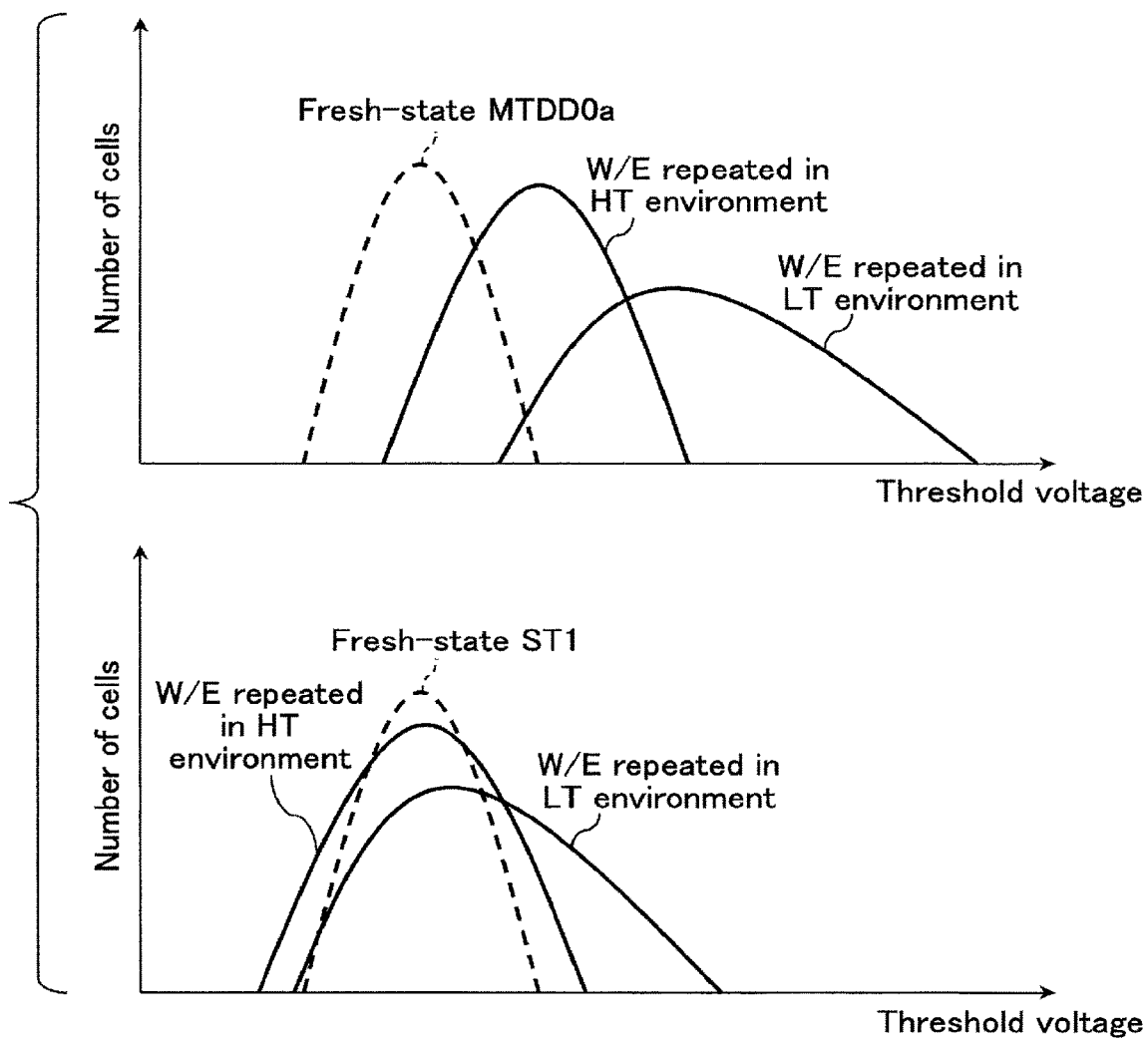
F I G. 8

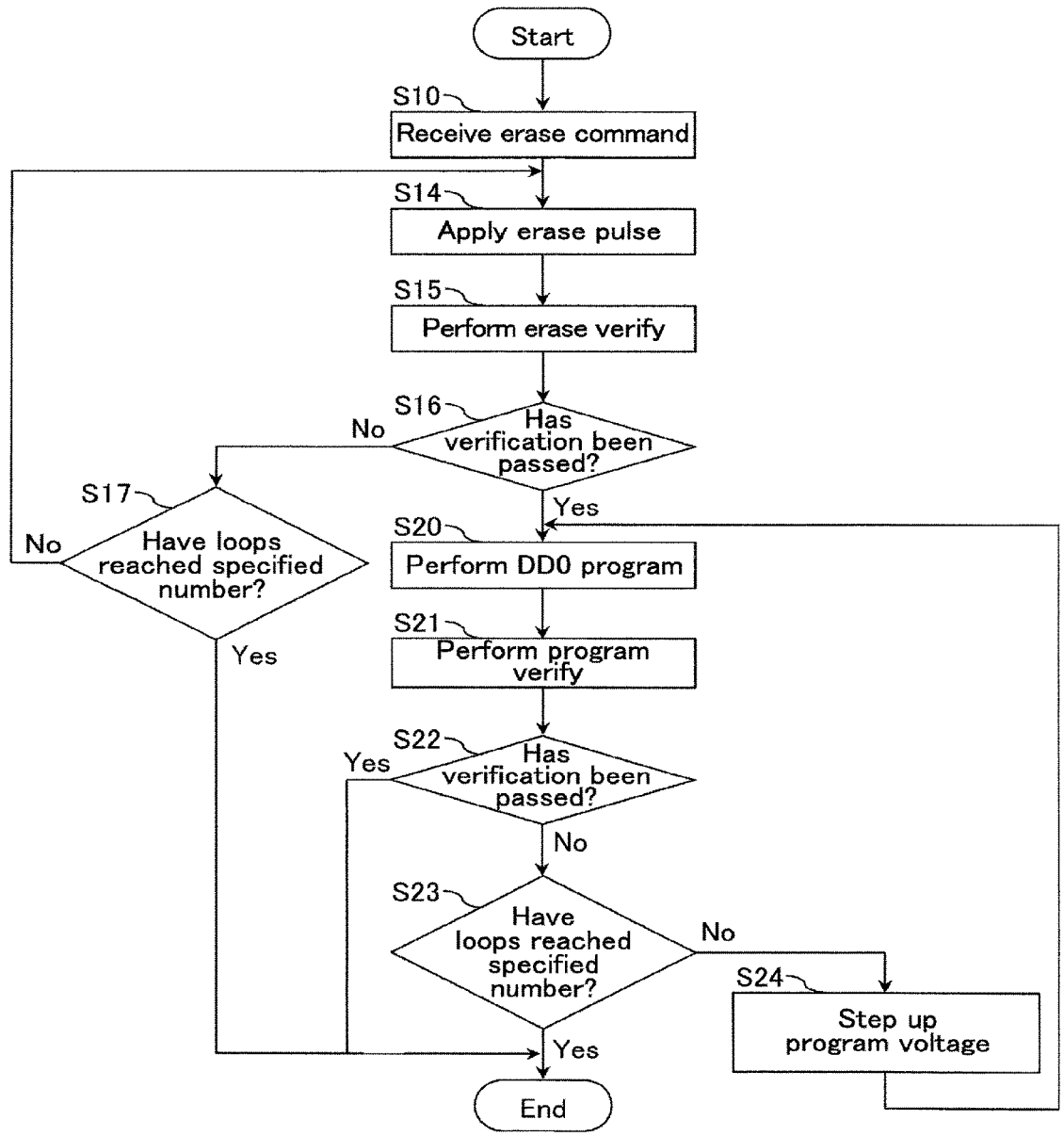
F I G. 9

SEMICONDUCTOR MEMORY DEVICE

CROSS-REFERENCE TO RELATED APPLICATIONS

This application is based upon and claims the benefit of priority from Japanese Patent Application No. 2018-049857, filed Mar. 16, 2018, the entire contents of which are incorporated herein by reference.

FIELD

Embodiments described herein relate generally to a semiconductor memory device.

BACKGROUND

A NAND-type flash memory is known as a semiconductor memory device.

BRIEF DESCRIPTION OF THE DRAWINGS

FIG. 1 is a block diagram of a semiconductor memory device according to a first embodiment;

FIG. 2 is a circuit diagram of a memory cell array in the semiconductor memory device according to the first embodiment;

FIG. 3 is a cross-sectional view of the memory cell array in the semiconductor memory device according to the first embodiment;

FIG. 4 is a flowchart of an erase operation in the semiconductor memory device according to the first embodiment;

FIG. 8 shows a threshold distribution diagram of a dummy memory cell transistor and a select transistor when the write/erase operation is repeated under the same voltage conditions in an environment of different temperatures.

FIG. 9 is a flowchart of an erase operation in a semiconductor memory device according to a second embodiment;

DETAILED DESCRIPTION

Figure 5:
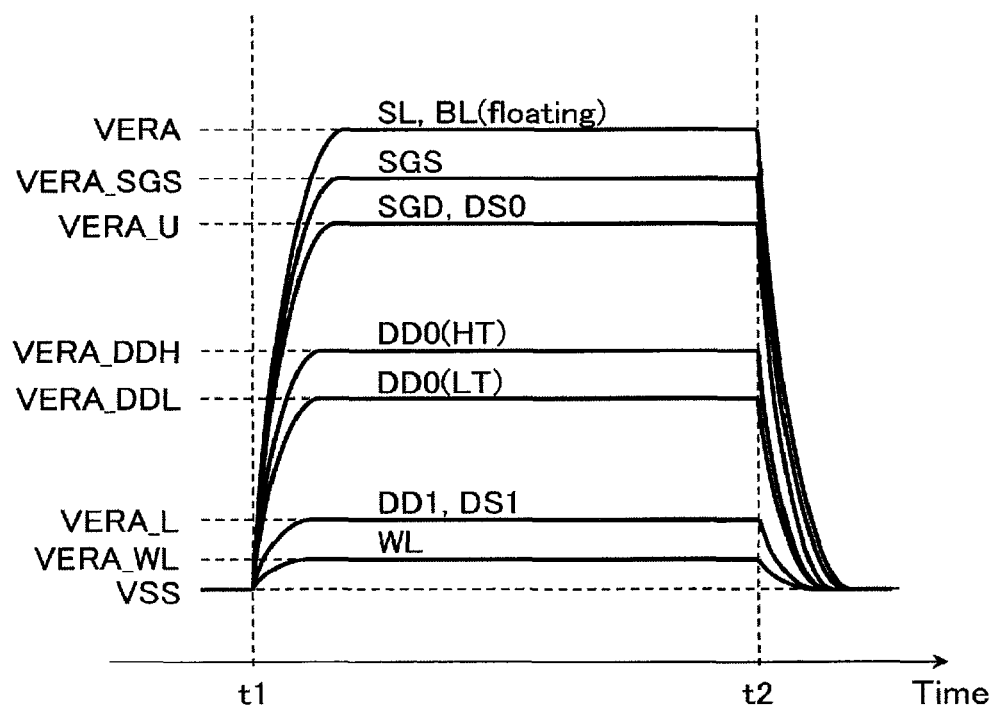
FIG. 5 is a timing chart showing voltages of interconnects during an erase pulse application operation in the semiconductor memory device according to the first embodiment.

In general, according to one embodiment, a semiconductor memory device includes: a memory string including a first select transistor, a first transistor adjacent to the first select transistor and coupled in series to the first select transistor, and a memory cell transistor coupled in series to the first transistor; a first select gate line coupled to a gate of the first select transistor; a first interconnect coupled to a gate of the first transistor; a word line coupled to a gate of the memory cell transistor; a row decoder for applying voltages to the first select gate line, the first interconnect, and the word line; a temperature sensor; and a control circuit for controlling an erase operation. In the erase operation, the control circuit selects a first mode for applying a first voltage to the first interconnect when a temperature measured by the temperature sensor is equal to or higher than a first temperature, and selects a second mode for applying a second voltage lower than the first voltage to the first interconnect when the temperature measured by the temperature sensor is less than the first temperature.

1. First Embodiment

A nonvolatile semiconductor memory device according to the first embodiment will be described. In the following, as a semiconductor memory device, a three-dimensional stacked NAND flash memory with memory cell transistors stacked on a semiconductor substrate will be described by way of example.

1.1 Configuration

1.1.1 Overall Configuration of Semiconductor Memory Device

First, an overall configuration of a nonvolatile semiconductor memory device according to the present embodiment will be described using FIG. 1. FIG. 1 is an example of a block diagram showing a basic overall configuration of the nonvolatile semiconductor memory device. In FIG. 1, a part of a coupling between blocks is indicated by arrows, but the coupling between blocks is not limited to them.

As illustrated in FIG. 1, a semiconductor memory device 1 includes a memory cell array 10, a row decoder 11, a sense amplifier 12, a source line driver 13, a sequencer 14, a voltage generator 15, and a temperature sensor 16.

The memory cell array 10 includes a plurality of blocks BLK (BLK0, BLK1, . . . ) including nonvolatile memory cell transistors associated with rows and columns (hereinafter, referred to as "memory cells" as well). Each of the blocks BLK includes, for example, four string units SU (SU0 to SU3). Each of the string units SU includes a plurality of NAND strings NS. The number of the blocks BLK in the memory cell array 10 and the number of the string units SU in the block ELK are discretionary. Details of the memory cell array 10 will be described later.

The row decoder 11 decodes a row address provided from an external controller (not shown). The row decoder 11 selects one of the blocks BLK based on the decode result, and further selects one of the string units SU. Then, the row decoder 11 outputs a required voltage to the memory cell array 10.

The sense amplifier 12 senses data read from the memory cell array 10 during a data read operation. The sense amplifier 12 transfers write data received from the external controller to the memory cell array 10 during a data write operation.

The source line driver 13 applies a required voltage to a source line during the write operation, the read operation, and the erase operation.

The sequencer 14 controls the entire operation of the semiconductor memory device 1. More specifically, the sequencer 14 controls the row decoder 11, the sense amplifier 12, the source line driver 13, the voltage generator 15, and the temperature sensor 16, during the write operation, the read operation, and the erase operation.

In accordance with the control of the sequencer 14, the voltage generator 15 generates voltages required for the write operation, the read operation, and the erase operation, and applies the generated voltages to the row decoder 11, the sense amplifier 12, the source line driver 13, etc. The row decoder 11, the sense amplifier 12, and the source line driver 13 apply the voltages supplied from the voltage generator 15 to memory cell transistors in the memory cell array 10.

In accordance with the control of the sequencer 14, the temperature sensor 16 monitors a temperature of the semiconductor memory device 1, and transmits the result to the sequencer 14.

1.1.2 Configuration of Memory Cell Array

Next, a configuration of the memory cell array 10 will be described using FIG. 2. The example of FIG. 2 shows the block BLK0, but other blocks BLK have the same configurations.

As illustrated in FIG. 2, the block BLK0 includes, for example, four string units SU (SU0 to SU3). Each of the string units SU includes a plurality of NAND strings NS. Each of the NAND strings NS includes, for example, sixty four memory cell transistors MT0 to MT63, five dummy memory cell transistors MTDD0a, MTDD0b, MTDD1, MTDS0, and MTDS1, and select transistors ST1 and ST2. In the following, the memory cell transistors MT0 to MT63 will be referred to as memory cell transistors MT unless otherwise specified. The dummy memory cell transistors MTDD0a, MTDD0b, MTDD1, MTDS0, and MTDS1 will be referred to as dummy memory cell transistors MTD unless otherwise specified.

Each of the memory cell transistors MT and each of the dummy memory cell transistors MTD are provided with a control gate and a charge storage layer. The memory cell transistors MT hold data in a nonvolatile manner. The dummy memory cell transistors MTD have the same configuration as that of the memory cell transistors MT, but are used as a dummy, not for holding data.

The memory cell transistors MT and the dummy memory cell transistors MTD may be of a MONOS type using insulating films for charge storage layers, or an FG type using conductive layers for charge storage layers. In the following, in the present embodiment, the MONOS-type transistors will be described by way of example. The number of memory cell transistors MT may be 8, 16, 32, 96, 128, etc., and the number is not limited. Furthermore, the number of dummy memory cell transistors MTD and the number of select transistors ST1 and ST2 are discretionary. Each of the select transistors ST1 and ST2 may be one or more.

The memory cell transistors MT and the dummy memory cell transistors MTD are coupled in series between the source of the select transistor ST1 and the drain of the select transistor ST2. More specifically, the dummy memory cell transistors MTDS0 and MTDS1, the memory cell transistors MT0 to MT63, and the dummy memory cell transistors MTDD1, MTDD0b, and MTDD0a are arranged so that their current paths are coupled in series. A drain of the dummy memory cell transistor MTDD0a is coupled to a source of the select transistor ST1, and a source of the dummy memory cell transistor MTDS0 is coupled to a drain of the select transistor ST2.

In the string units SU0 to SU3, the gates of the select transistors ST1 are coupled to respective select gate lines SGD0 to SGD3. In the string units SU0 to SU3, the gates of the select transistors ST2 are coupled in common to the select gate line SGS. In the following, the select gate lines SGD0 to SGD3 will be referred to as select gate lines SGD unless otherwise specified. The gates of the select transistors ST2 in the string units SU0 to SU3 may be coupled to different select gate lines SGS0 to SGS3.

The control gates of the memory cell transistors MT0 to MT63 in the block BLK are coupled in common to word lines WL0 to WL63, respectively. The control gates of the dummy memory cell transistors MTDD0a and MTDD0b in the block BLK are coupled in common to the dummy word line DD0. The control gates of the dummy memory cell transistors MTDD1, MTDS0, and MTDS1 in the block BLK are coupled in common to dummy word lines DD1, DS0, and DS1, respectively. In the following, the word lines WL0 to WL63 will be referred to as word lines WL unless otherwise specified. The dummy word lines DD0 and DD1 will be referred to as dummy word lines DD unless otherwise specified, and dummy word lines DS0 and DS1 will be referred to as dummy word lines DS unless otherwise specified. The dummy memory cell transistors MTDD0a and MTDD0b will be referred to as dummy memory cell transistors MTDD0 unless otherwise specified.

In one string unit SU, the select transistors ST1 of the NAND strings NS have their drains coupled to different bit lines BL0 to BL(N−1, N being an integer of 2 or more), respectively. In the following, the bit lines BL0 to BL(N−1) will be referred to as bit lines BL unless otherwise specified. Each of the bit lines BL couples one NAND string NS included in each string unit SU in the plurality of blocks ELK. Furthermore, the sources of the plurality of select transistors ST2 are coupled in common to a source line SL. That is, each of the string units SU is an assembly of NAND strings NS coupled to the different bit lines BL and coupled to the same select gate line SGD. Each of the blocks BLK is an assembly of the plurality of string units SU sharing the word lines WL. The memory cell array 10 is an assembly of the plurality of blocks BLK sharing the bit lines BL.

The write operation and the read operation are performed together at once on the memory cell transistors MT coupled to one of the word lines WL in one of the string units SU, respectively.

1.1.3 Cross-Sectional Configuration of Memory Cell Array

Next, a cross-sectional configuration of the memory cell array 10 will be described using FIG. 3. The example of FIG. 3 shows a cross-section of one NAND string NS. In FIG. 3, interlayer insulating films are omitted.

As illustrated in FIG. 3, an insulating layer 21 is formed on a semiconductor substrate 20. On the insulating layer 21, a conductive layer 22, an interconnect layer 23, and a conductive layer 24, extending in the parallel first direction D1, are stacked. The conductive layer 22, the interconnect layer 23, and the conductive layer 24 function as the source line SL.

For the insulating layer 21, a silicon oxide film is used, for example. For the conductive layers 22 and 24, polycrystalline silicon is used, for example. The interconnect layer 23 is made of a conductive material, an example of which includes tungsten (W). A circuit such as the sense amplifier 12 etc. maybe provided in a region of the insulating layer 21, i.e., between the semiconductor substrate 20 and the conductive layer 22.

On the conductive layer 24, a NAND string NS is formed along the third direction D3 vertical to the semiconductor substrate To be more specific, an interconnect layer 25 functioning as the select gate line SGS, sixty nine layers of interconnect layers 26 functioning as the dummy word lines DD and DS and the word lines WL, and an interconnect layer 27 functioning as the select gate line SGD, are stacked in order on the conductive layer 24, while interlayer insulating films (not shown) are interposed. The interconnect layers 25, 26, and 27 are made of conductive materials, an example of which includes tungsten (W).

A pillar-shaped semiconductor layer 28, that penetrates the interconnect layers 27, 26, and 25 and has a bottom surface reaching the conductive layer 24, is formed. The semiconductor layer 28 functions as a current path of the NAND string NS, and is a region where a channel of each transistor is formed. The upper end of the semiconductor layer 28 is coupled to an interconnect layer (not shown) functioning as a bit line BL. On the side surface of the semiconductor layer 28, a tunnel insulating film 29, a charge storage layer 30, and a block insulating film 31 functioning as a control gate are formed in order. For the semiconductor layer 28, polycrystalline silicon is used, for example. For the tunnel insulating film 29 and the block insulating film 31, silicon oxide films are used, for example. For the charge storage layer 30, a silicon nitride film is used, for example. In the following, a pillar formed of the semiconductor layer 28, the tunnel insulating film 29, the charge storage layer 30, and the block insulating film 31 is referred to as a "memory pillar MP".

The memory pillar MP and the interconnect layer 26 form the memory cell transistors MT and the dummy memory cell transistors MTD. In addition, the memory pillar MP and the interconnect layer 27 form the select transistor ST1, and the memory pillar MP and the interconnect layer 25 form the select transistor ST2. In the example of FIG. 3, one interconnect layer 25 and one interconnect layer 27 are provided, but multiple layers thereof may be provided.

1.2 Erase Operation

Next, an erase operation will be described. The erase operation includes an erase pulse application operation for applying an erase pulse to decrease a threshold voltage Vth of the memory cell transistor MT, and an erase verify operation for determining whether the threshold voltage. Vth of the memory cell transistor MT is lower than a target value as a result of the application of the erase pulse.

The erase pulse application operation of the present embodiment includes two erase modes, "LT (low temperature) mode" and "HT (high temperature) mode", in accordance with the temperature of the semiconductor memory device 1. In LT and HT modes, voltages applied to the dummy word line DD0 are different. The voltage of the dummy word line DD0 is higher in the HT mode than that in the LT mode.

1.2.1 Overall Flow of Erase Operation

Next, an overall flow of the erase operation will be described using FIG. 4.

As illustrated in FIG. 4, the semiconductor memory device 1 first receives an erase command from the external controller (step S10).

Upon receipt of the erase command, the sequencer 14 controls the temperature sensor 16 to measure a temperature of the semiconductor memory device 1. If a measured temperature Tmoni of the semiconductor memory device 1 is lower than a preset temperature Ts, the sequencer 14 selects the LT mode (step S11_Yes). In this case, the sequencer 14 sets the voltage of the dummy word line DD0 in the erase pulse application operation to a voltage VERA_DDL (step S12). The voltage VERA_DDL is higher than a voltage VERA_WL applied to the word lines WL, and is a voltage at which the dummy memory cell transistors MTDD0 are in a weaker erase state than the memory cell transistors MT. In the dummy memory cell transistors MTDD0, the threshold voltage Vth slightly increases by the write operation, which requires a corresponding weak erase operation.

On the other hand, if the temperature Tmoni of the semiconductor memory device 1 is equal to or higher than the preset temperature Ts, the sequencer 14 selects the HT mode (step S11_No). In this case, the sequencer 14 sets the voltage of the dummy word line DD0 in the erase pulse application operation to a voltage VERA_DDH (step S13). The voltage VERA_DDH is higher than the voltage VERA_DDL, and is a voltage at which the dummy memory cell transistors MTDD0 are in a weaker erase state than the LT mode.

Next, the sequencer 14 performs an erase pulse application operation (step S14). Details of the voltages of interconnects in the erase pulse application operation will be described later.

Next, the sequencer 14 performs an erase verify operation (step S15).

If the erase verification has been passed (step S16_Yes), the sequencer 14 ends the erase operation.

On the other hand, if the erase verification has been failed (step S16_No), the sequencer 14 checks whether the number of erase loops of repeating the erase pulse application operation and the erase verify operation has reached the preset specified number (step S17).

If the number of erase loops has reached the specified number (step S17_Yes), the sequencer 14 ends the erase operation, and reports to the external controller that the erase operation was not ended normally.

If the number of erase loops has not reached the specified number (step S17_No), the processing returns to step S14, and the sequencer 14 applies an erase pulse again.

The sequencer 14 repeats the erase loops until the erase verification is passed or the number of erase loops reaches the specified number.

1.2.2 Voltages of Interconnects During Erase Pulse Application Operation

Next, voltages of interconnects during the erase pulse application operation will be described using FIG. 5. The example of FIG. 5 shows the voltages applied to interconnects in the selected block BLK during the erase pulse application operation.

As shown in FIG. 5, at time t1, the source line driver 13 applies a voltage VERA as an erase pulse to the source line SL. The voltage VERA is a high voltage for generating a gate induced drain leakage (GIDL) current in a junction interface between the conductive layer 24 and the semiconductor layer 28. The row decoder 11 applies a voltage VERA_SGS to the select gate line SGS of the erase target block BLK. The voltage VERA_SGS is a high voltage for setting the select transistor ST2 to an ON state and generates the GIDL current. The voltage VERA_SGS satisfies a relationship VERA>VERA_SGS. On the other hand, the sense amplifier 12 blocks an electrical coupling with the bit line BL to bring the bit line BL into a floating state. To the bit line BL, the voltage VERA is applied from the NAND string NS side.

In this state, the row decoder 11 applies a voltage VERA_WL to the word lines WL of the erase target block BLK. The voltage VERA_WL is sufficiently smaller than the voltage VERA to pull electrons out of the charge storage layer 30. The potential difference between the voltage VERA and the voltage VERA_WL causes electrons to be pulled out of the charge storage layer 30 of the memory cell transistor MT coupled to the word line WL (or holes are supplied to the charge storage layers 30) to thereby erase data.

The row decoder 11 applies a voltage VERA_L to the dummy word lines DD1 and DS1, and applies a voltage VERA_U to the select gate lines SGD (SGD0 to SGD3) and the dummy word line DS0. The row decoder 11 further applies a voltage VERA_DDL to the dummy word line DD0 in the LT mode, and applies a voltage VERA_DDH to the dummy word line DD0 in the HT mode.

The voltage VERA_L is higher than the voltage VERA_WL and lower than voltage VERA_DDL. Since the potential difference with the voltage VERA is smaller than that with the voltage VERA_WL, the dummy memory cell transistors MTDD1 and MTDS1 are in a weaker erase state than the memory cell transistors MT. The voltage VERA_U is a voltage for preventing the target select transistor ST1 and dummy memory cell transistor MTDS0 from being in an erase state. The voltage VERA_U is higher than the voltage VERA_DDH and lower than the voltage VERA_SGS.

The voltages VERA_WL, VERA_SGS, VERA_L, VERA_U, VERA_DDL, and VERA_DDH have a relationship VERA_WL<VERA_L<VERA_DDL<VERA_DDH<VERA_U<VERA_SGS.

At and after time t2, recovery processing is performed, and the erase pulse application operation is ended. That is, the voltage VSS is applied to each interconnect.

1.3 Effects According to First Embodiment

With the configuration of the present embodiment, reliability of the semiconductor memory device can be improved. Details of the effects will be described.

In the NAND-type flash memory, if the write/erase operation (W/E) is repeated, variations are caused in the threshold voltages Vth of the select transistor ST1 and the dummy memory cell transistor MTDD0a (and MTDD0b), which might cause false operations.

Figure 6:
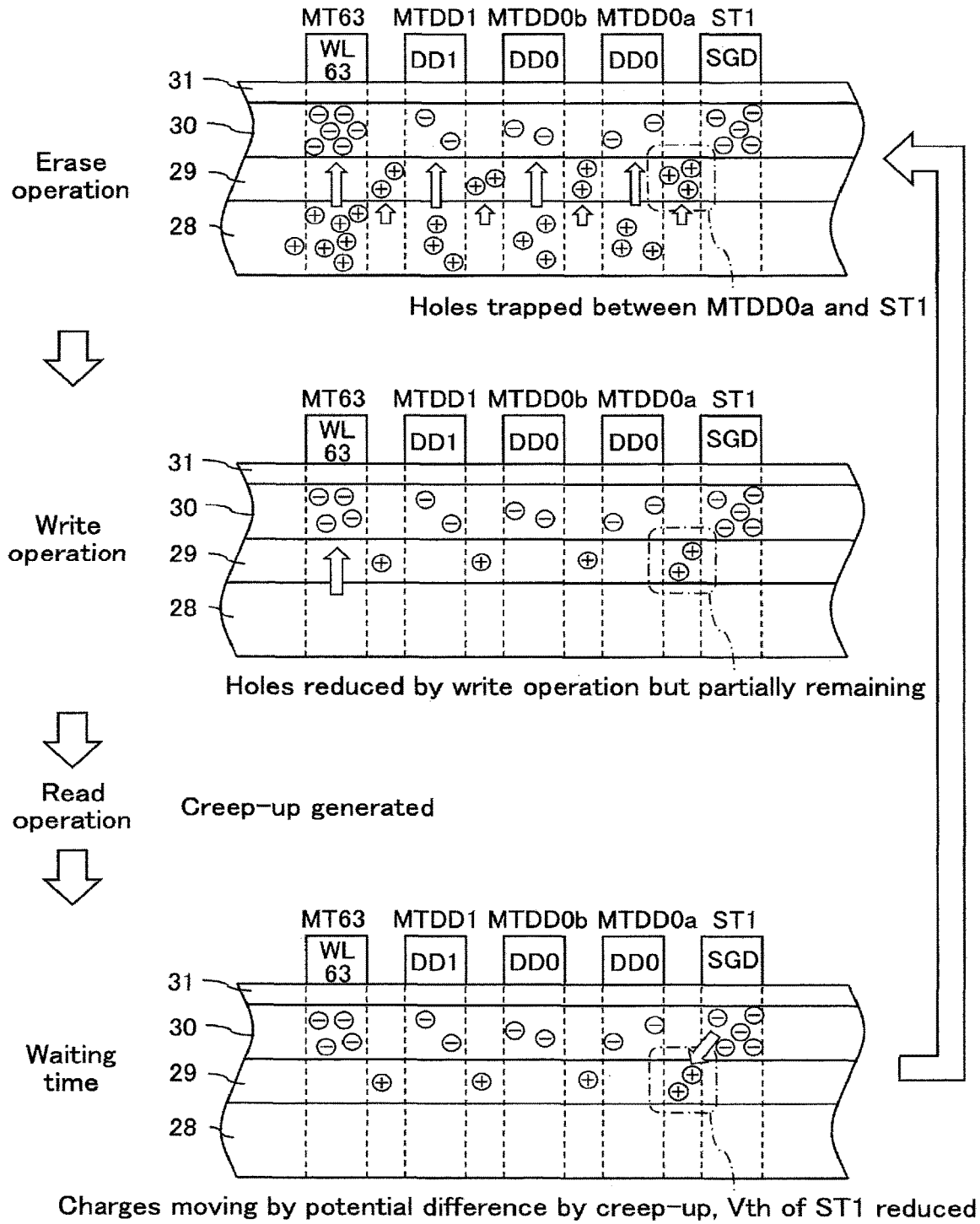
FIG. 6 shows an example of behaviors of charges and holes in a memory pillar in an erase operation, a write operation, a read operation, and a waiting period after the read operation.

First, a reduction in the threshold voltage Vth of the select transistor ST1 will be described in detail using FIG. 6. FIG. 6 shows behaviors of charges and holes in the memory pillar MP in the erase operation, the write operation, the read operation, and the waiting (left) period after the read option. In order to simplify the explanation, the example of FIG. 6 shows part of the cross-section of the memory pillar MP corresponding to the memory cell transistor MT63, the dummy memory cell transistors MTDD1, MTDD0b and MTDD0a, and the select transistor ST1, and their corresponding word line WL63, dummy word lines DD1 and DD0, and select gate line SGD.

As illustrated in FIG. 6, during the erase operation, holes (positive charges) are supplied to the charge storage layer 30 from the semiconductor layer 28. At this time, part of the holes are trapped in the tunnel insulating film 29. As a result, holes are also trapped in the tunnel insulating film 29 between the dummy memory cell transistor MTDD0a and the select transistor ST1.

Next, when the write operation is performed, part of the holes trapped in the tunnel insulating film 29 are annihilated by injection of charges (negative charges). However, since the holes are not completely eliminated, the holes remain in the tunnel insulating film 29 between the dummy memory cell transistor MTDD0a and the select transistor ST1.

Next, when the read operation is performed, the voltages of the word lines WL and the dummy word lines DD increase by creep-up caused after the read operation. A simple explanation of creep-up will provided using FIG. 7.

Figure 7:
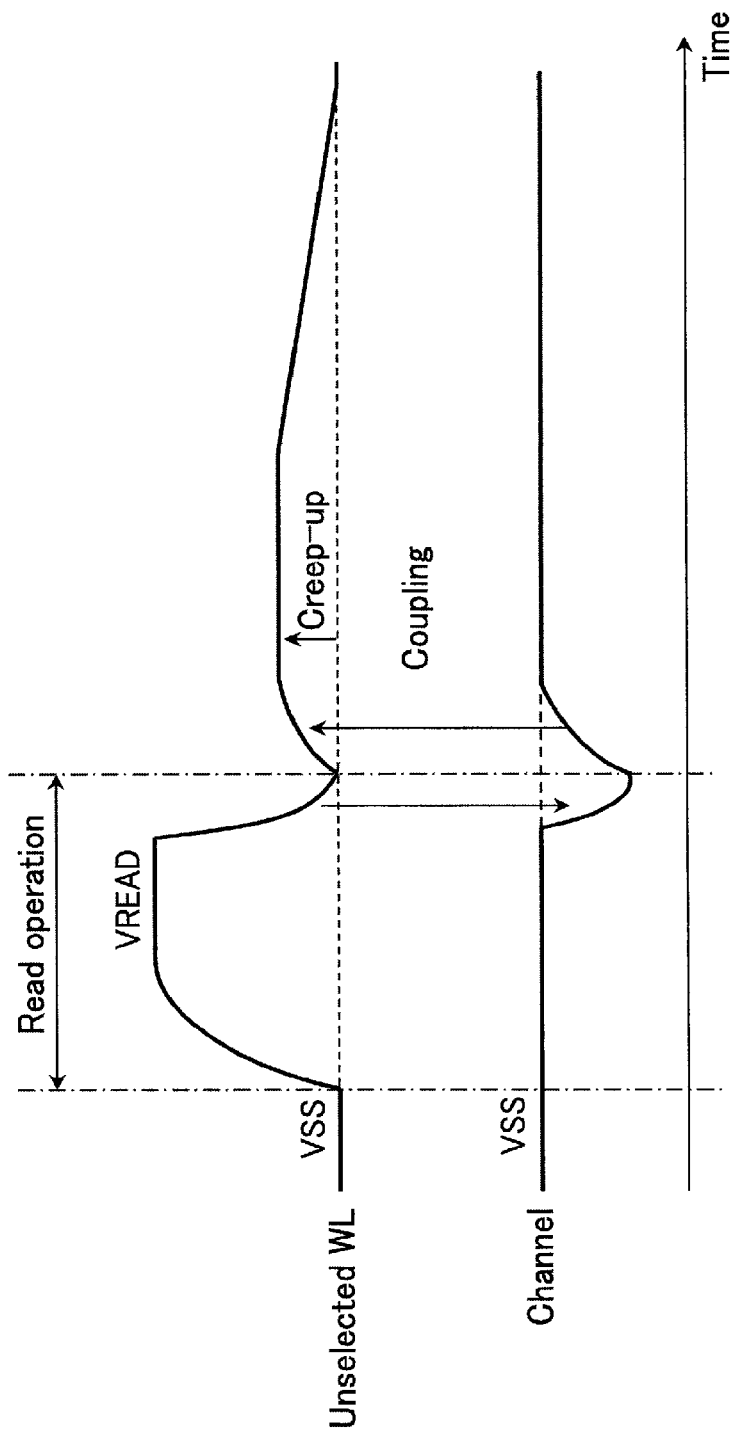
FIG. 7 shows an example of potentials of a word line WL and a channel of a NAND string NS during the read operation.

FIG. 7 shows an example of potentials of the word line WL and the channel of the NAND string NS during the read operation.

As shown in FIG. 7, the row decoder 11 applies a voltage VREAD to an unselected word line WL of the selected block BLK during the read operation. The voltage VREAD is a voltage for setting the corresponding memory cell transistor MT to an ON state. When the read data is determined, the row decoder 11 lowers the voltage of the unselected word line WL to a ground voltage VSS. At this time, since the select transistors ST1 and ST2 are in the cutoff state, a channel is in a floating state. Thus, the channel potential is lowered from the ground voltage VSS to a negative voltage by coupling with the word line WL. After the read operation, as a result of setting the block BLK to be unselected, the word line WL is made floating. In this state, when the channel potential of the negative voltage returns to the ground voltage VSS as time passes, the voltage of the word line WL increases from the ground voltage VSS by coupling with the channel. This phenomenon is called creep-up.

Returning back to FIG. 6, when the word line WL and the dummy word lines DD0 and DD1 are in the waiting (left) state while being in the creep-up state, because creep-up hardly occurs in the select gate line SGD, a potential difference between the dummy word line DD0 and the select gate line SGD, i.e., an electrical field, is generated. Consequently, part of charges in the charge storage layer 30 of the select transistor ST1 are recombined with the holes in the tunnel insulating film 29 and annihilated. As a result, the threshold voltage Vth of the select transistor ST1 is decreased. Thus, if the write/erase operation is repeated, the threshold voltage Vth of the select transistor ST1 gets lowered.

Furthermore, if the write/erase operation is repeated, the threshold voltages Vth of the dummy memory cell transistor MTDD0a and the select transistor ST1 vary in accordance with the temperature of the semiconductor memory device 1. This relationship will be described using FIG. 8. FIG. 8 shows variations in the threshold distribution of the dummy memory cell transistor MTDD0a and the select transistor ST1 when the write/erase operation is repeated under the same voltage conditions in the environment of different temperatures.

As shown by the upper part of FIG. 8, for example, if the potential difference between the channel and the dummy word line DD0 is relatively small during the erase pulse application operation, i.e., the voltage of the dummy word line DD0 is relatively high, it is not possible to sufficiently erase erroneous writing on the dummy memory cell transistor MTDD0a during the program operation. For this reason, if the write/erase operation is repeated, the threshold distribution of the dummy memory cell transistor MTDD0a increases from a fresh state (a state where the write/erase operation is not repeated). Erroneous writing results from hot carriers due to the potential difference between the select gate line SGD and the dummy word line DD0. When the write/erase operation is repeated in the low temperature (LT) environment, the mean free path of hot carriers (electrons) becomes longer because the lattice vibration is small at low temperature. Thus, if the write/erase operation is repeated in a low temperature environment, an increase in the threshold distribution by erroneous writing becomes higher as compared to when the write/erase operation is repeated in a high temperature (HT) environment. This tendency is more significant when the potential difference between the channel and the dummy word line DD0 is smaller during the erase pulse application operation, i.e., when the voltage of the dummy word line DD is higher.

As shown by the lower part of FIG. 8, in the threshold distribution of the select transistor ST1, the lower skirt extends more when the write/erase operation is repeated in the high temperature environment as compared to when the write/erase operation is repeated in the low temperature environment. On the other hand, the upper skirt of the threshold distribution of the select transistor ST1 extends more when the write/erase operation is repeated in the low temperature environment as compared to when the write/erase operation is repeated in the high temperature environment, because of the influence of the increases in the threshold voltage Vth of the dummy memory cell transistor MTDD0a.

In contrast, according to the configuration of the present embodiment, the semiconductor memory device includes the temperature sensor, and in the erase operation, it is possible to select one of the two modes in accordance with the temperature of the semiconductor memory device to change the voltage applied to the dummy word line DD0.

More specifically, if the temperature Tmoni of the semiconductor memory device is equal to or higher than the preset temperature Ts, the HT mode is selected to apply the voltage VERA_DDH to the dummy word line DD0, and if the temperature Tmoni of the semiconductor memory device is lower than the preset temperature Ts, the LT mode is selected to apply the voltage VERA_DDL lower than the voltage VERA_DDH to the dummy word line DD0.

Thereby in the LT mode, by erasing the dummy memory cell transistor MTDD0a in a relatively stronger manner, it is possible to more strongly suppress an increase in the threshold voltages Vth of the dummy memory cell transistor MTDD0a and the select transistor ST1 due to the repetition of the write/erase operation. In the HT mode, by erasing the dummy memory cell transistor MTDD0a in a relatively weaker manner, it is possible to reduce the amount of holes trapped in the tunnel insulating film 29 between the dummy memory cell transistor MTDD0a and the select transistor ST1 and more strongly suppress the reduction in the threshold voltage Vth of the select transistor ST1. In this manner, it is possible to efficiently suppress variations in the threshold voltages Vth of the dummy memory cell transistor MTDD0a and the select transistor ST1.

Accordingly, it is possible to suppress erroneous operations caused by the threshold variations in the dummy memory cell transistor MTDD0a and the select transistor ST1, and to improve reliability of the semiconductor memory device.

The present embodiment has set the LT mode and the HT mode, i.e., the two types of voltages applied to the dummy word line DD0, in accordance with the temperature of the semiconductor memory device, but three or more types may be set for voltages applied to the dummy word line DD0 in accordance with the temperature.

2. Second Embodiment

Next, the second embodiment will be described. In the second embodiment, an erase operation different from that in the first embodiment will be described. In the following, mainly the parts different from those of the first embodiment will be described. In this embodiment, the temperature sensor 16 may be eliminated.

2.1 Erase Operation

An erase operation of the present embodiment will be described. In the erase operation of the present embodiment, the write operation on the dummy memory cell transistors MTDD0 (MTDD0a and MTDD0b) is performed after the erase loop. By the write operation on the dummy memory cell transistors MTDD0, holes trapped in the tunnel insulating film 29 between the dummy memory cell transistor MTDD0a and the select transistor ST1 are reduced. At this moment, in the write operation on the dummy memory cell transistors MTDD0, in order to suppress an increase in threshold voltage Vth of the dummy memory cell transistors MTDD0, a write operation weaker than a write operation on the memory cell transistors MT is performed (the amount of increase in the threshold voltage Vth is small).

The write operation on the dummy memory cell transistors MTDD0 roughly includes a program operation and a program verify operation. By repeating the combination of the program operation and the program verify operation (hereinafter referred to as a "program loop"), the threshold voltage Vth is increased to a target level. The same applies to the write operation on the memory cell transistors MT.

The program operation is an operation of injecting electrons into the charge storage layer to increase the threshold voltage Vth (or inhibiting the injection to maintain the threshold voltage Vth) In the following, the operation for increasing the threshold voltage Vth is referred to as an ""0" write". The operation for maintaining the threshold voltage Vth is referred to as a ""1" write" or "write inhibit". More specifically, in the "0" write and the "1" write, the voltages of the bit lines BL are different. For example, the voltage VSS is applied to a bit line BL corresponding to "0" write conditions. A voltage VBL (>VSS) is applied to a bit line BL corresponding to the "1" write. In the following, the bit line corresponding to the "0" write will be referred tows BL ("0"), and the bit line corresponding to the "1" write will be referred to as BL ("1").

In the following, the program operation on the dummy memory cell transistors MTDD0 is referred to as a "DD0 program operation". In the program operation on the memory cell transistors MT, a program voltage VPGM of a high voltage is applied to a selected word line WL. In comparison, in the DD0 program operation, a voltage VP_DD0 lower than the voltage VPGM is applied to the dummy word line DD0 so that the amount of increase in threshold voltage Vth becomes smaller than that in the program operation on the memory cell transistors MT.

2.2 Overall Flow of Erase Operation

An overall flow of the erase operation will be described using FIG. 9.

As illustrated in FIG. 9, the semiconductor memory device 1 first receives an erase command from the external controller (step S10).

The sequencer 14 performs an erase pulse application operation based on the erase command (step S14). At this time, the row decoder 11 applies a preset voltage (e.g., the voltage VERA_DDL) to the dummy word line DD0.

Next, the sequencer 14 performs an erase verify operation (step S15).

If the erase verification has been failed (step S16_No), as explained in relation to FIG. 4 of the first embodiment, the sequencer 14 repeats the erase loop until the erase verification is passed or the number of erase loops reaches the specified number. If the number of erase loops has reached the specified number (step S17_Yes), the sequencer 14 ends the erase operation, and reports to the external controller that the erase operation was not ended normally.

On the other hand, if the erase verification has been passed (step S16_Yes), the sequencer 14 performs the DD0 program operation (step S20).

Next, the sequencer 14 performs the program verify operation (step S21).

If the program verification has been passed (step S22_Yes), the sequencer 14 ends the erase operation.

On the other hand, if the program verification has been failed (step S22_No), the sequencer 14 checks whether the number of program loops has reached the preset specified number (step S23).

If the number of program loops has not reached the specified number (step S23_No), the sequencer 14 steps up the setting value of the program voltage (step S24). Then, the processing returns to step S20, and the sequencer 14 performs the DD0 program operation again.

If the number of program loops has reached the specified number (step S23_Yes), the sequencer 14 ends the erase operation, and reports to the external controller that the erase operation was not ended normally.

2. Example of Voltages of Interconnects During DD0 Program Operation

Next, an example of the voltages of interconnects during the DD0 program operation will be described using FIG. 10. The example of FIG. 10 shows the voltages applied to interconnects in the selected block BLK during the DD0 program operation.

Figure 10:
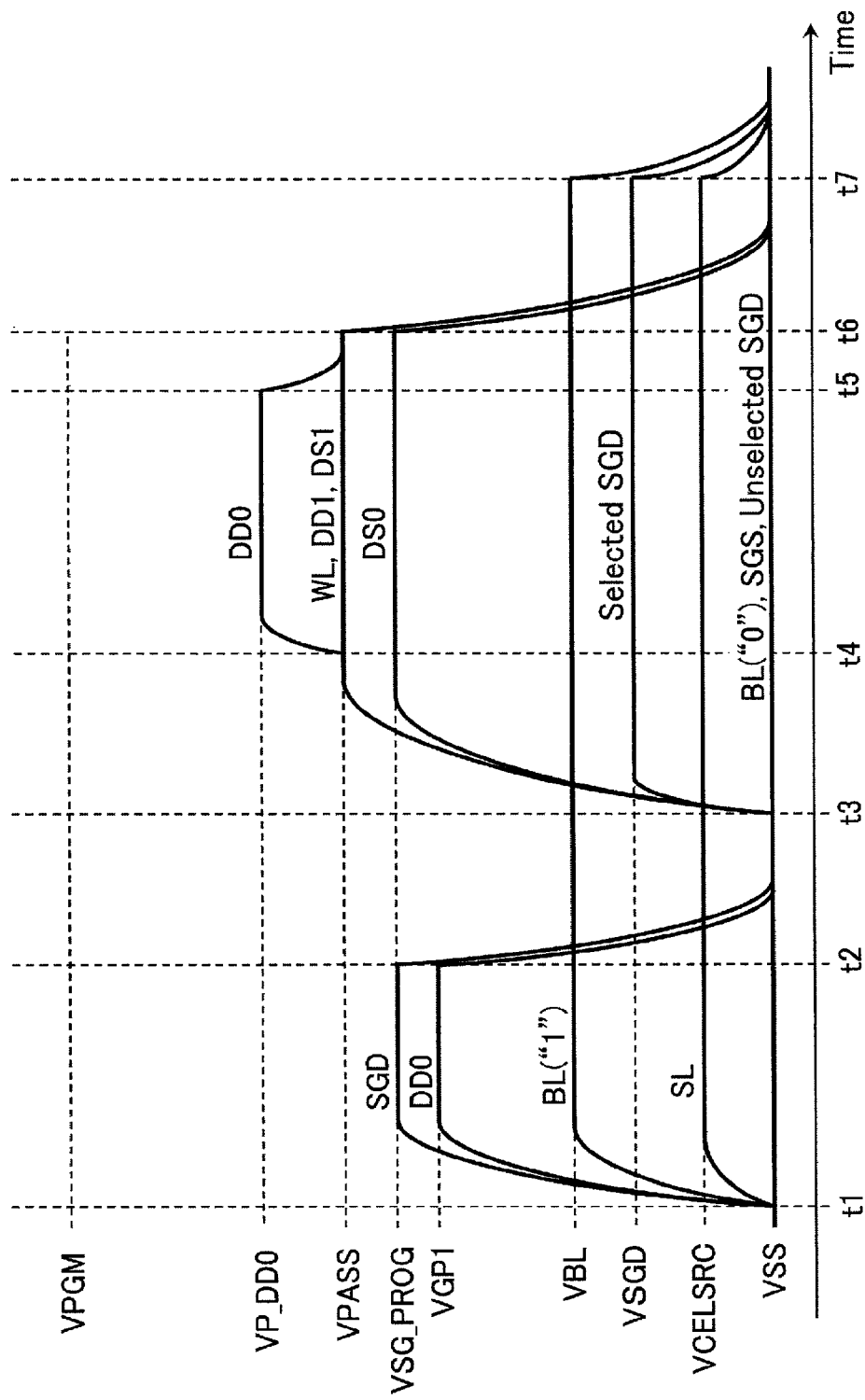
FIG. 10 is a timing chart showing voltages of interconnects during a DD0 program operation in the semiconductor memory device according to the second embodiment.

As shown in FIG. 10, at time t1, the row decoder 11 applies a voltage VSG_PROG to the select gate line SGD in the selected block BLK. The voltage VSG_PROG is equal to or higher than "VBL+threshold voltage Vth of the select transistor ST1", and is a voltage for setting the select transistor ST1 to an ON state. The row decoder 11 applies the voltage VSS to the select gate line SGS to set the select transistor ST2 to an OFF state. The row decoder 11 further applies a voltage VGP1 to the dummy word line DD0. The voltage VGP1 is a voltage for setting the dummy memory cell transistors MTDD0a and MTDD0b to an ON state. In the example of FIG. 10, the voltages VSG_PROG and VGP1 has a relationship VSG_PROG>VGP1, but the relationship is not limited to this.

The source line driver 13 applies a voltage VCELSRC (>VSS) to the source line SL.

The sense amplifier 12 applies a voltage VBL to a bit line BL ("1"), i.e., a bit line BL corresponding to a write inhibit dummy memory cell transistor MTDD0. On the other hand, the sense amplifier 12 applies a voltage VSS to a bit line ("0"), i.e., a bit line BL corresponding to a program target dummy memory cell transistor MTDD0.

Thereby, the voltage VBL is applied to a channel of the NAND string NS corresponding to the bit line BL ("1"), and the voltage VSS is applied to a channel of the NAND string NS corresponding to the bit line BL ("0"). In the following, a time period of times t1 and t2 is referred to as a "BL pre-charge".

At time t2, the row decoder 11 applies a voltage VSS to the select gate line SGD and the dummy word line DD0.

At time t3, the row decoder 11 applies a voltage VSGD to a select gate line SGD ("selected SGD") corresponding to a selected string unit SU, and applies the voltage VSS to a select gate line SGD ("unselected SGD") corresponding to an unselected string unit SU. The voltage VSGD is lower than the voltages VGP1 and VBL. With the voltage VSGD, the select transistor ST1 to which the voltage VSS is applied is set to an ON state while the select transistor ST1 to which the voltage VBL is applied is set to a cutoff state. This brings a channel of the NAND string NS corresponding to the bit line BL ("1") into a floating state. The row decoder 11 applies a voltage VPASS to the word lines WL and the dummy word lines DD0, DD1, and DS1, and applies the voltage VSG_PROG to the dummy word line DS0. The voltages VPASS and VSG_FROG are voltages for setting the corresponding memory cell transistors MT and dummy memory cell transistors MTD to an ON state regardless of the threshold voltages Vth. The voltages VPASS and VSG_PROG has a relationship VPASS>VSG_PROG.

During times t4 and t5, the row decoder 11 applies a voltage VP_DD0 as a DD0 program voltage to the dummy word line DD0 The voltage VP_DD0 is lower than the voltage VPGM and higher than the voltage VPASS.

In the NAND string NS corresponding to the bit line BL ("0"), the select transistor ST1 is in an ON state. Thus, a channel potential of the dummy memory cell transistors MTDD0 coupled to the dummy word line DD0 is maintained in VSS. Thus, the potential difference between the control gate and the channel (VP_DD0-VSS) becomes larger, and as a result, electrons are injected into the charge storage layer, and the threshold voltage Vth of the dummy memory cell transistors MTDD0 increases. At this time, holes trapped in the tunnel insulating film 29 between the dummy memory cell transistor MTDD0a and the select transistor ST1 are reduced.

In the NAND string NS corresponding to the bit line BL ("1"), the select transistor ST1 is in a cutoff state. Thus, the channels of the dummy memory cell transistors MTDD0 coupled to the dummy word line DD0 are made electrically floating. This increases the channel potential by capacitive coupling with the dummy word line DD0. Thus, the potential difference between the control gate and the channel becomes smaller, and as a result, electrons are hardly injected into the charge storage layer, and the threshold voltage Vth of the dummy memory cell transistor MTDD0 is maintained (the threshold does not vary sufficiently to cause the threshold distribution level to transition to a higher distribution level).

At time t5, the row decoder 11 applies the voltage VPASS to the dummy word line DD0.

At times t6 and t7, the sequencer 14 performs recovery processing and ends the program operation. That is, the voltage VSS is applied to each interconnect.

2.4 Effects According to Present Embodiment

According to the configuration of the present embodiment, in the erase operation, it is possible to perform the DD0 program operation after the erase loop. Thereby, it is possible to reduce, by the DD0 program operation, the holes trapped in the tunnel insulating film 29 between the dummy memory cell transistor MTDD0a and the select transistor ST1 due to the erase voltage application operation, and to suppress a reduction in the threshold voltage Vth of the select transistor ST1. Moreover, by the DD0 program operation, it is possible to control the threshold voltage Vth of the dummy memory cell transistor TDD0.

Accordingly, it is possible to suppress erroneous operations caused by variations in the thresholds of the dummy memory cell transistor MTDD0a and the select transistor ST1, and to improve reliability of the semiconductor memory device.

The first and second embodiments may be combined.

3. Third Embodiment

Next, the third embodiment will be described. In the third embodiment, a description will be given of a read operation to suppress creep-up of the dummy word line DD0. In the following, only the parts different from those of the first and second embodiments will be described. In this embodiment, the temperature sensor 16 may be eliminated.

3.1 Example of Voltages of Interconnects During Read Operation

Figure 11:
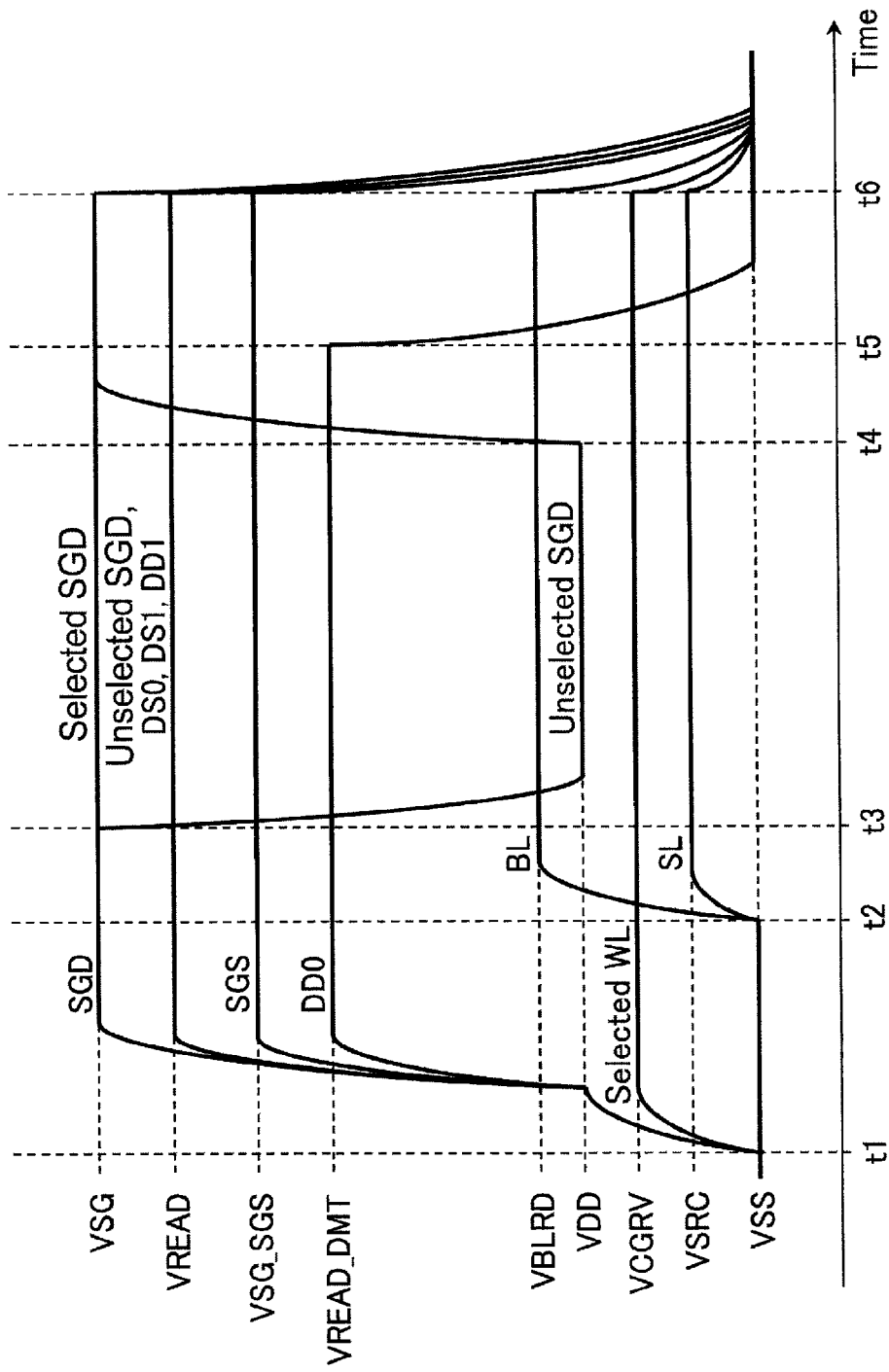
FIG. 11 is a timing chart showing voltages of interconnects during a read operation in a semiconductor memory device according to a third embodiment.

An example of the voltages of interconnects during the read operation will be described using FIG. 11. In order to simplify the explanation, the example of FIG. 11 shows a case where the read operation corresponding to one threshold level is performed. For example, when the memory cell transistors MT hold multi-valued data and a read operation of a plurality of threshold levels is performed, a read voltage VCGRV corresponding to each threshold level is applied to a selected word line WL. The voltage VCGRV is a voltage corresponding to a threshold level of data to be read. The erase verify operation and the program verify operation have similar waveforms, and the read voltage VCGRV of the selected word line WL is different according to a verification level.

As shown in FIG. 11, at time t1, the row decoder 11 applies the voltage VSG to the select gate line SGD in the selected block ELK. Furthermore, the row decoder 11 applies a voltage VSG_SGS to the select gate line SGS. The voltages VSG and VSG_SGS are voltages for setting the select transistors ST1 and ST2 to an ON state. The row decoder 11 applies a voltage VREAD to unselected word lines WL and the dummy word lines DD1, DS0, and DS1, and applies a voltage VREAD_DMT to the dummy word line DD0. The voltages VREAD and VREAD_DMT are voltages for setting the corresponding memory cell transistors MT and dummy memory cell transistors MTD to an ON state.

In the example of FIG. 11, the voltages VSG, VSG_SGS, VREAD, and VREAD_DMT have a relationship VREAD_DMT<VSG_SGS<VREAD<VSG, but the relationship is not limited to this. For example, the voltages VSG, VSG_SGS, VREAD, and VREAD_DMT may be set in accordance with the threshold voltages Vth of corresponding select transistors ST1 and ST2, memory cell transistors MT, dummy memory cell transistors MTD, and the like.

In the example of FIG. 11, when applying the voltages VSG, VREAD, VSG_SGS, and VREAD_DMT, the row decoder 11 raises voltages by two steps, i.e., by first applying the voltage VDD to the corresponding interconnect and then raising the voltage to a set voltage, but the configuration is not limited to this. For example, the voltages of interconnects may be raised by a single step without the voltage VDD.

In this state, the row decoder 11 applies a voltage VCGRV to a selected word line WL. The voltages VCGRV and VREAD has a relationship VCGRV<VREAD.

At time t2, the sense amplifier 12 applies the voltage VBLRD to the bit line BL. The voltage VBLRD is a voltage applied to the bit line BL during the read operation. The source line driver 13 applies a voltage VSRC to the source line SL. The voltages VBLRD and VSRC has a relationship VBLRD>VSRC (>VSS).

At time t3, the row decoder 11 continues to apply the voltage VSG to a select gate line SGD (selected SGD) corresponding to a selected string unit SU, and applies, for example, a voltage VDD to a select gate line SGD (unselected SGD) corresponding to an unselected string unit SU. The select transistor ST1 corresponding to the unselected string unit SU is thereby set to a cutoff state. In this state, during the period of times t3 and t4, the sense amplifier 12 reads data.

At time t4, the row decoder 11 applies the voltage VSG to the select gate line SGD corresponding to the unselected string unit SU.

At time t5, the row decoder 11 applies the voltage VSS to the dummy word line DD0 and drops the voltage before the voltage of the select gate line SGD is dropped. In other words, when the select transistor ST1 is an ON state, the dummy memory cell transistors MTDD0 are set to an OFF state.

At time t6, recovery processing is performed, and the read operation is ended. More specifically, the row decoder 11 applies the voltage VSS to the select gate lines SGD and SGS, the word lines WL, and the dummy word lines DD1, DS0, and DS1. Thus, their corresponding select transistors ST1 and ST2, memory cell transistors MT, and dummy memory cell transistors MTDD1, MTDS0, and MTDS1 are set to an OFF state. The sense amplifier 12 applies the voltage VSS to the bit line BL. The source line driver 13 applies a voltage VSS to the source line SL.

When a read operation of a plurality of threshold levels is performed, the period of times t2 to t5, for example, is repeated for every threshold level. In this case, a voltage VCGRV corresponding to each threshold voltage is set.

3.2 Effects According to Present Embodiment

Figure 12:
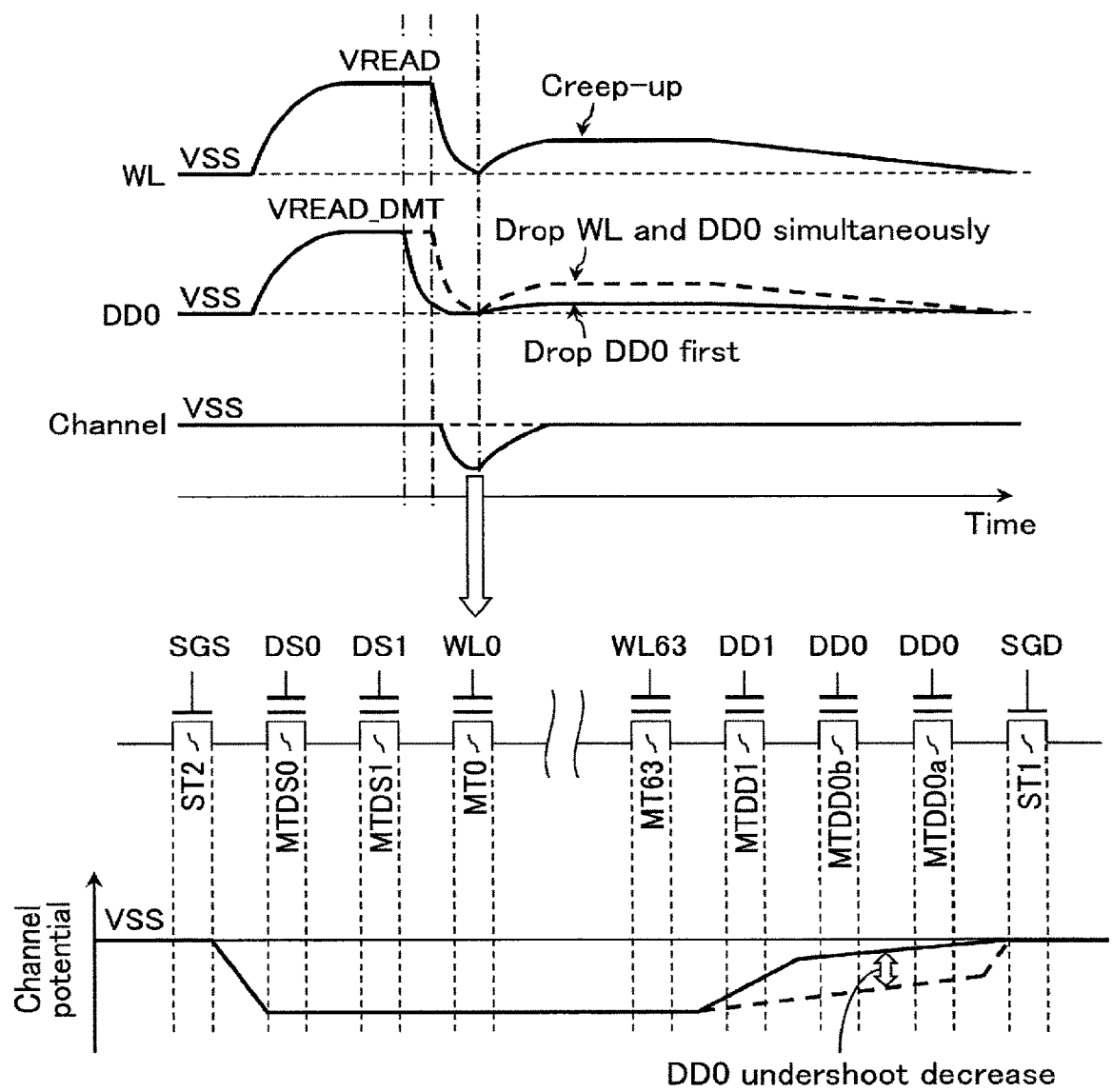
FIG. 12 shows a relationship between a timing to drop voltages of word lines and dummy word lines in a read operation and an undershoot of a channel potential.

With the configuration according to the present embodiment, it is possible to suppress a reduction in the threshold voltage Vth of the select transistor ST1. This effect will be described using FIG. 12. FIG. 12 shows a relation between a timing to drop the voltages of the word line WL and the dummy word line DD0 and undershoot of a channel potential in the read operation.

As shown in FIG. 12, when the voltage of the word line WL is dropped in the read operation, the channel potential is lowered (undershot) to a negative voltage from the ground voltage VSS, since the select transistors ST1 and ST2 are in an OFF state. The undershoot amount of the channel potential of each memory cell transistor MT and dummy memory cell transistor MTD has a relationship, for example, memory cell transistor MT (=dummy memory cell transistors MTDS0 and MTDS1)>dummy memory cell transistor MTDD1>dummy memory cell transistor MTDD0b>dummy memory cell transistor MTDD0a.

As a comparative example, when the voltages of the word line WL and the dummy word line DD0 are dropped at the same timing (dashed line in FIG. 12), the undershoot amount of the channel potential of the dummy memory cell transistor MTDD0a is relatively large due to the influence of coupling by a voltage rise of the dummy word line DD0.

In contrast, according to the configuration of the present embodiment, in the read operation, the row decoder 11 first applies the voltage VSS to the dummy word line DD0, and thereafter applies the voltage VSS to the select gate line SGD. In other words, it is possible to set the select transistor ST1 to an OFF state after the dummy memory cell transistor MTDD0 is set to an OFF state. Since the select transistor ST1 is in an ON state when the voltage of the dummy word lines DD0 is dropped, the channel of the dummy memory cell transistor MTDD0a is less influenced by coupling by voltage dropping of the dummy word line DD0. Therefore, the undershoot amount of the channel potential of the dummy memory cell transistor MTDD0a can be smaller than when the voltages of the select gate line SGD and the dummy word line DD0 are dropped at the same timing. Accordingly, it is possible to suppress an increase in the voltage of the dummy word line DD0 due to creep-up. Thus, in the waiting time after the read operation, the potential difference caused between the dummy word line DD0 and the select gate line SGD by creep-up can be reduced. It is therefore possible to suppress a reduction in the threshold voltage Vth of the select transistor ST1 by the recombination of the charges in the charge storage layer 30 of the select transistor ST1 with the holes in the tunnel insulating film 29.

The third embodiment may be combined with the first and second embodiments.

4. Fourth Embodiment

Next, the fourth embodiment will be described. In the fourth embodiment, a description of the voltages of interconnects in the program verify operation of the write operation will be provided. In the following, only the parts different from those of the first to third embodiments will be described. In this embodiment, the temperature sensor 16 may be abandoned.

4.1 Example of Voltages of Interconnects During Write Operation

Figure 13:
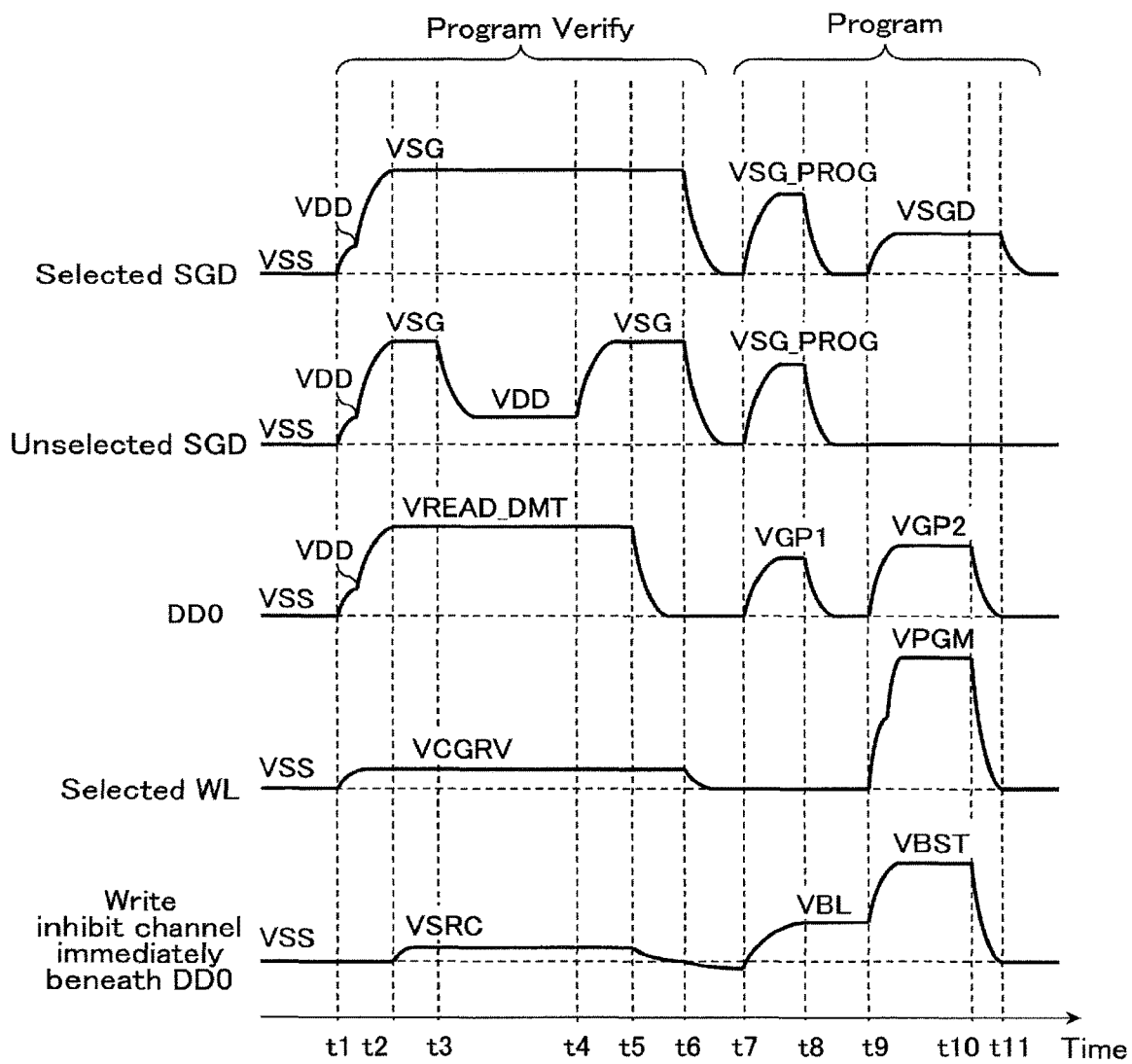
FIG. 13 is a timing chart when a program verify operation and a program operation are continuously performed in a semiconductor memory device according to a fourth embodiment.

An example of the voltages of interconnects during the write operation will be described using FIG. 13. The example of FIG. 13 shows a timing chart when the program verify operation and the program operation are performed continuously. In order to simplify the explanation, the example of FIG. 13 shows the potentials of the select gate line SGD, the dummy word line DD0, the selected word line WL, and the channel of the dummy memory cell transistor MTDD0a in the write inhibit NAND string (write inhibit channel immediately beneath DD0) in the selected block BLK.

As shown in FIG. 13, the period including times t1 to t6 corresponds to the program verify operation, and the period including times t7 to t11 corresponds to the program operation.

At time t1, the row decoder 11 first applies a voltage VSG to the select gate line SGD, applies a voltage VREAD_DMT to the dummy word line DD0, and then applies a voltage VCGRV to the selected word line WL.

At time t2, the source line driver 13 applies a voltage VSRC to the source line SL. Thus, the channel potential of the dummy memory cell transistor MTDD0a in the write inhibit NAND string NS increases to the voltage VSRC.

At time t3, the row decoder 11 continues to apply the voltage VSG to a select gate line. SGD (selected SGD) corresponding to a selected string unit SU, and applies, for example, a voltage VDD to a select gate line SGD (unselected SGD) corresponding to an unselected string unit SU.

At time t4, the row decoder 11 applies the voltage VSG to the select gate line SGD corresponding to the unselected string unit SU.

At time t5, the row decoder 11 applies the voltage VSS to the dummy word line DD0 and drops the voltage before the voltage of the select gate line SGD is dropped. In other words, when the select transistor ST1 is an ON state, the dummy memory cell transistors MTDD0 are set to an OFF state. As a result, the channel potential of the dummy memory cell transistor MTDD0a in the write inhibit NAND string lowers to the voltage VSS.

At time t6, the row decoder 11 applies the voltage VSS to the select gate line SGD. The channel potential of the dummy memory cell transistor MTDD0a in the write inhibit NAND string lowers to a negative voltage due to the influence of other memory cell transistors MT and dummy memory cell transistors MTD.

At time t7, for BL pre-charging in the program operation, the row decoder 11 applies the voltage VSG_PROG to the select gate line SGD, and applies the voltages VGP1 to the dummy word line DD0. The sense amplifier 12 applies the voltage VBL to the bit line BL ("1") corresponding to the write inhibit Thereby, the channel potential of the dummy memory cell transistor MTDD0a in the write inhibit NAND string increases to the voltage VBL.

At time t8, the row decoder 11 applies the voltage VSS to the select gate line SGD and the dummy word line DD0. The write inhibit NAND string NS is brought into a floating state, and the channel potential of the dummy memory cell transistor MTDD0a maintains the voltage VBL.

At time t9, the row decoder 11 applies the voltage VSGD to the select gate line SGD corresponding to the selected string unit SU, applies the voltage VGP2 to the dummy word line DD0, and applies the voltage VPGM to the selected word line WL. The voltage VGP2 is a voltage for setting the dummy memory cell transistors MTDD0a and MTDD0b to an ON state. Since the write inhibit NAND string NS is in a floating state, the channel potential of the dummy memory cell transistor MTDD0a increases to a voltage VBST by coupling with the dummy word line DD0. The voltage VBST is a voltage increased by coupling, and is higher than the voltage VBL.

At time t10, the row decoder 11 applies the voltage VSS to the dummy word line DD0 and the selected word line WL. The channel potential of the dummy memory cell transistor MTDD0a in the write inhibit NAND string decreases to the voltage VSS.

At time t11, the row decoder 11 applies the voltage VSS to the select gate line SGD. The sense amplifier 12 applies the voltage VBL to the bit line BL ("1") corresponding to the write inhibit.

4.2 Effects According to Present Embodiment

According to the configuration of the present embodiment, it is possible to suppress an increase in the threshold voltage Vth of the select transistor ST1. Details of the effects will be described.

For example, when the voltages of the select gate line SGD and the dummy word line DD0 are dropped concurrently when the program verify operation is completed, the voltage of the dummy word line DD0 is lowered while the select transistor ST1 is in the cutoff state. By coupling, the undershoot amount of the channel potential of the dummy memory cell transistors MTDD0a increases. If BL pre-charging of a next program operation is started and the select transistor ST1 is set to an ON state in this state, the voltage VBL is applied from the bit line BL to the channel of the select transistor ST1. Then, hot carriers are generated due to a potential difference caused between the dummy memory cell transistor MTDD0a and the select transistor ST1, and the generated hot carriers are injected into the select transistor ST1. As a result, the threshold voltage Vth of the select transistor ST1 increases.

In contrast, with the configuration according to the present embodiment, in the program verify operation, the row decoder 11 first applies the voltage VSS to the dummy word line DD0 and thereafter applies the voltage VSS to the select gate line SGD. In other words, it is possible to set the select transistor ST1 to an OFF state after the dummy memory cell transistor MTDD0 is set to an OFF state. Since the select transistor ST1 is in an ON state when the voltage of the dummy word line DD0 is dropped, the channel of the dummy memory cell transistor MTDD0a is less influenced by coupling by voltage dropping of the dummy word line DD0. Therefore, the undershoot amount of the channel potential of the dummy memory cell transistors MTDD0a can be smaller than when the voltages of the select gate line SGD and the dummy word line DD0 are dropped at the same timing. This can suppress a generation of hot carriers in a next program operation, and can suppress an increase in the threshold voltage Vth of the select transistor ST1.

The fourth embodiment may be combined with the first to third embodiments.

5. Modifications, etc.

The semiconductor memory device according to the above embodiments includes: a memory string (NS) including a first select transistor (ST1), a first transistor (MTDD0a) adjacent to the first select transistor and coupled in series to the first select transistor, and a memory cell transistor (MT0) coupled in series to the first transistor; a first select gate line (SGD) coupled to a gate of the first select transistor; a first interconnect (DD0) coupled to a gate of the first transistor; a word line (WL0) coupled to a gate of the memory cell transistor; a row decoder (11) for applying voltages to the first select gate line, the first interconnect, and the word line; a temperature sensor (16); and a control circuit (14) for controlling an erase operation. In the erase operation, the control circuit selects a first mode for applying a first voltage (VERA_DDH) to the first interconnect when a temperature (Tmoni) measured by the temperature sensor is equal to or higher than a first temperature (Ts), and selects a second mode for applying a second voltage (VERA_DDL) lower than the first voltage to the first interconnect when the temperature measured by the temperature sensor is less than the first temperature.

The application of the above-described embodiments allows for the provision of a semiconductor memory device that can be made more reliable.

The present invention is not limited to the above-described embodiments, and various modifications are possible.

For example, the above embodiments have described the three-dimensional stacked NAND flash memory with memory cell transistors MT stacked on a semiconductor substrate, but the above-described embodiments can be applied to a plane NAND flash memory with memory cell transistors MT arranged two dimensionally on a semiconductor substrate.

Moreover, the aforementioned embodiments can be combined to the extent possible. For example, the second to fourth embodiments may be applied to the first embodiment.

Furthermore, the phrase "coupling" in the above-described embodiments includes a state in which components are indirectly connected with another component such as a transistor or a resistor interposed therebetween.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory string including a first select transistor, a first transistor adjacent to the first select transistor and coupled in series to the first select transistor, and a memory cell transistor coupled in series to the first transistor;
a first select gate line coupled to a gate of the first select transistor;
a first interconnect coupled to a gate of the first transistor;
a word line coupled to a gate of the memory cell transistor;
a row decoder to which the first select gate line, the first interconnect, and the word line are coupled;
a temperature sensor; and
a control circuit for controlling an erase operation,
wherein in the erase operation, the control circuit selects a first mode for applying a first voltage to the first interconnect when a temperature measured by the temperature sensor is equal to or higher than a first temperature, and selects a second mode for applying a second voltage lower than the first voltage to the first interconnect when the temperature measured by the temperature sensor is less than the first temperature.

2. The device according to claim 1, wherein in the erase operation, the row decoder applies a third voltage lower than the second voltage to the word line, and applies a fourth voltage higher than the first voltage to the first select gate line.

3. The device according to claim 2, wherein the memory string further includes a second select transistor coupled in series to the memory cell transistor,
a gate of the second select transistor is coupled to the row decoder through a second select gate line, and
in the erase operation, the row decoder applies a fifth voltage higher than the fourth voltage to the second select gate line.

4. The device according to claim 3, further comprising a source line to which the memory string is coupled,
wherein in the erase operation, a sixth voltage higher than the fifth voltage is applied to the source line.

5. The device according to claim 1, further comprising:
a bit line coupled to the memory string; and
a sense amplifier to which the bit line is coupled,
wherein in the erase operation, the sense amplifier puts the bit line into an electrically non-coupled state.

6. The device according to claim 3, wherein
the memory string further includes:
a second transistor adjacent to the first transistor, coupled in series to the first transistor, and including a gate coupled to the row decoder through a second interconnect;
a third transistor adjacent to the second select transistor, coupled in series between the memory cell transistor and the second select transistor, and including a gate coupled to the row decoder through a third interconnect; and
a fourth transistor adjacent to the third transistor, coupled in series between the memory cell transistor and the third transistor, and including a gate coupled to the row decoder through a fourth interconnect,
in the erase operation, the row decoder applies a seventh voltage higher than the third voltage and lower than the second voltage to the second and fourth interconnects, and applies the fourth voltage to the third interconnect.

* * * * *